(12) United States Patent
Kitamoto et al.

(10) Patent No.: US 6,515,927 B2
(45) Date of Patent: Feb. 4, 2003

(54) SEMICONDUCTOR MEMORY HAVING A WIDE BUS-BANDWIDTH FOR INPUT/OUTPUT DATA

(75) Inventors: Ayako Kitamoto, Kawasaki (JP); Masato Matsumiya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/067,236

(22) Filed: Feb. 7, 2002

(65) Prior Publication Data

US 2003/0007403 A1 Jan. 9, 2003

(30) Foreign Application Priority Data

Jul. 9, 2001 (JP) ........................................ 2001-207580

(51) Int. Cl.[7] ................................................ G11C 7/00
(52) U.S. Cl. .................... 365/205; 365/189.01; 365/203
(58) Field of Search ............................ 365/205, 189.04, 365/189.05, 203, 230.03, 230.08, 189.01

(56) References Cited

U.S. PATENT DOCUMENTS 6,031,785 A * 2/2000 Park et al. ............. 365/189.04
6,118,718 A * 9/2000 Yabe ..................... 365/189.01

* cited by examiner

*Primary Examiner*—David Lam
(74) *Attorney, Agent, or Firm*—Arent Fox Kintner Plotkin & Kahn, PLLC

(57) ABSTRACT

During a read operation, data read from memory cells onto bit lines are amplified simultaneously by sense amplifiers and outputted to the exterior of a memory. In this operation, a data control circuit outputs to the exterior all the data read from the memory cells onto the bit lines and amplified simultaneously by the sense amplifiers. During a write operation, data supplied from the exterior to the bit lines are amplified by the sense amplifiers and written into the memory cells. In this operation, the data control circuit writes into the memory cells all the data inputted from the exterior and amplified simultaneously by the sense amplifiers. Since all the data amplified simultaneously by the sense amplifiers are inputted/outputted from/to the exterior, the data transfer rate of the input/output data can be improved and the power consumption per unit amount of transferred data can be reduced.

19 Claims, 13 Drawing Sheets

SEMICONDUCTOR MEMORY HAVING A WIDE BUS-BANDWIDTH FOR INPUT/OUTPUT DATA

BACKGROUND OF THE INVENTION

1. Field of the Invention

This invention relates to a semiconductor memory and more particularly to a semiconductor memory having a wide bus-bandwidth for input/output data.

2. Description of the Related Art

In general, a semiconductor memory includes memory cells arranged at the respective intersections of word lines and bit lines wired vertically and horizontally. The bit lines are connected to sense amplifiers that amplify data to be inputted to and data outputted from the memory cells.

In a read operation of this kind of semiconductor memory, a word line is selected in accordance with an address signal (a row address signal) supplied from the exterior of the memory, and the data held in the memory cells are transferred to the bit lines. The sense amplifiers amplify the data transferred onto the bit lines. Besides, in accordance with address signals (column address signals), part of the amplified data are selected and outputted to the exterior of the memory as a read data. The data amplified by the sense amplifiers (including the remaining data that are not read out to the exterior) are rewritten into the memory cells, and the read operation is completed.

In a write operation, first of all, similarly to the read operation, a word line is selected in accordance with a row address signal, and data are outputted from the memory cells. The data read out onto the bit lines are amplified by the sense amplifiers. After the sense amplifiers start their amplifying operations, write data from the exterior are transferred to the bit lines selected in accordance with column address signals. At this moment, on the selected bit lines, if the data read from the memory cells are different from the write data, the levels of the bit lines are inverted. Then, the write data are written into the memory cells. On the unselected bit lines, the data amplified by the sense amplifiers are rewritten into the memory cells.

Conventionally, as described above, only the part of the data amplified by the sense amplifiers are outputted to the exterior as the read data or written into the memory cells as the write data. In other word, the sense amplifiers directly contributing to the read and write operations are only part of the activated sense amplifiers.

For example, in a case when 512 memory cells are connected to each word line, during a read operation (or a write operation), 512 sense amplifiers are simultaneously activated. In such a case, if the data input/output terminals are of 8 bits, the number of sense amplifiers directly contributing to a read operation is only eight, which is only 1/64 of the number of activated sense amplifiers. The remaining 63/64 thereof, that is, 504 sense amplifiers operate just for rewriting the data into the memory cells. That is, the sense amplifiers that are not necessary to particular data input/output operations are activated unnecessarily.

Since each of the bit lines is connected to a plurality of memory cells, its wiring length is long and its load capacitance is large. Since the sense amplifiers must charge and discharge the bit lines having a large load capacitance, their power consumption is larger as compared with the power consumption of other logical circuits in the memory. Thus, charging and discharging the bit lines unnecessarily prevents the reduction of power consumption. Besides, since the sense amplifiers directly contributing to the data input/output operations are only part of the activated sense amplifiers as described above, there is a problem that the power consumption per unit amount of inputted/outputted data is large.

Conventionally, in order to raise the data transfer rate, some approaches to broaden the bus bandwidth of the inputted/outputted data are adopted. In these approaches, however, it is not attempted to modify the ratio of the number of sense amplifiers contributing to the read and write operations to the number of sense amplifiers operating only to rewrite the data. Accordingly, when the bus bandwidth of the input/output data is doubled, the number of simultaneously activated sense amplifiers is also doubled.

Raising the data transfer rate may be also realized by raising the operational frequency of the semiconductor memory. However, if the operational frequency f is raised, it will increase the charge and discharge currents of the transistors, causing the circuit power consumption P to become large, as can be seen from the following equation (1):

$$P = C \cdot V^2 \cdot f \qquad (1)$$

where C is a load capacitance and V is a power supply voltage.

Additionally, there is another problem that in general, the higher the operational frequency is, the more difficult the circuit design and the layout design are.

Recently, a demand for a semiconductor memory exhibiting a low power consumption and a high data transfer speed at the same time has been increased with the prevalence of mobile devices, the large-scaling of systems, the reduction of required power source voltage, and the spread of applications to image processing and the like.

SUMMARY OF THE INVENTION

It is an object of the present invention to provide a semiconductor memory, which has a wide bus-bandwidth, and enables low power consumption at the same time.

It is another object of the present invention to provide a semiconductor memory, which shortens access time.

According to one of the aspects of the semiconductor memory of the present invention, the semiconductor memory has a plurality of memory cells, a plurality of bit lines respectively connected to the memory cells, a plurality of sense amplifiers respectively connected to the bit lines, and a data control circuit. For example, during a read operation, the data read from the memory cells onto the bit lines are amplified simultaneously by the sense amplifiers and outputted to the exterior of the memory. In this read operation, the data control circuit outputs all the data read from the memory cells and amplified simultaneously by the sense amplifiers to the exterior. During a write operation, the data supplied from the exterior to the bit lines are amplified simultaneously by the sense amplifiers and written into the memory cells. In this write operation, the data control circuit writes into the memory cells all the data inputted from the exterior and amplified simultaneously by the sense amplifiers. Since all the data amplified simultaneously by the sense amplifiers are inputted/outputted from/to the exterior, the data transfer rate of inputted/outputted data can be increased, and the power consumption per unit amount of transferred data can be reduced.

According to another aspect of the semiconductor memory of the present invention, a plurality of data bus lines are respectively formed corresponding to the bit lines for inputting/outputting the data from/to the exterior. Since the data amplified simultaneously by the sense amplifiers can be inputted/outputted in parallel via the data bus lines, the data transfer rate can be increased by using a simple control circuit.

According to another aspect of the semiconductor memory of the present invention, the data bus lines are wired along a wiring direction of the bit lines. This facilitates the wiring layout of the data bus lines.

According to another aspect of the semiconductor memory of the present invention, the data bus lines are formed by using wiring layer(s) different from a wiring layer of the bit lines. A wiring pitch of the data bus lines is equal to an integral multiple of a wiring pitch of the bit lines. The wiring is aligned by having the wiring pitch of the data bus lines equal to an integral multiple of the wiring pitch of the bit lines. Therefore, this harmonization in the wiring pitches between the bit lines and the data bus lines allows many wires to be efficiently arranged.

According to another aspect of the semiconductor memory of the present invention, the data bus lines are composed of read data bus lines for transferring the data read from the memory cells and write data bus lines for transferring the data to be written into the memory cells. By separating the data bus lines into those for read operations and those for write operations, the read and the write data can be simultaneously transferred within the chip, which shortens the access time, realizing a high-speed access.

According to another aspect of the semiconductor memory of the present invention, at least one of the read data bus lines and the write data bus lines is composed of complementary data line pair. Accordingly, the influence of noise on the read or the write data can be reduced, which allows these data to be surely transferred within the chip.

According to another aspect of the semiconductor memory of the present invention, both the read data bus lines and the write data bus lines are of single-phase. This allows the wiring region of the data bus lines to be smaller, resulting in a reduction of the chip cost.

According to another aspect of the semiconductor memory of the present invention, the data bus lines are input-output common bus lines for transferring the data read from the memory cells and the data to be written into the memory cells. Making the data bus lines usable for both input and output operations can further reduce the wiring region of the data bus lines.

According to another aspect of the semiconductor memory of the present invention, the semiconductor memory has a plurality of switches for connecting the bit lines to the data bus lines respectively. These switches are turned on simultaneously in response to activation of the sense amplifiers. Since there is no need to control the switches per each sense amplifier, switch controlling can be easily performed.

According to another aspect of the semiconductor memory of the present invention, the bit lines are composed of complementary bit line pair and the data bus lines are composed of complementary data line pair corresponding to the complementary bit line pair. This agreement in structure between the bit lines and the data bus lines facilitates the configuration of circuits connecting these signal lines. For example, the bit lines and the data bus lines can be connected to each other via simple switches.

According to another aspect of the semiconductor memory of the present invention, the data control circuit transfers to the bit lines the data to be written into the memory cells, the transfer done during a write operation and before a word line is selected. According to the present invention, all the data supplied from the exterior and amplified simultaneously by the sense amplifiers are written into the memory cells. Therefore, even if the data held in the memory cells before the write operation are destroyed, it will cause no problems. That is, there is no need to rewrite the data into the memory cells during the write operation. Since the time required to rewrite the data is no longer required, the write operation can be executed at a high speed as compared with the prior art.

According to another aspect of the semiconductor memory of the present invention, the data control circuit transfers to the bit lines the data to be written into the memory cells, the transfer done during a write operation and before the sense amplifiers amplify the data held in the memory cells. Since all the data supplied from the exterior and amplified simultaneously by the sense amplifiers are written into the memory cells, it is not necessary that the data held in the memory cells before the write operation be amplified simultaneously by the sense amplifiers and be rewritten into the memory cells. Accordingly, since the time required to rewrite the data is no longer required, the write operation can be executed at a high speed as compared with the prior art.

According to another aspect of the semiconductor memory of the present invention, address signals for selecting the memory cells are supplied from the exterior at once. Receiving the address signals at once allows a control circuit to control the address signals easily.

According to another aspect of the semiconductor memory of the present invention, the semiconductor memory has a word line for connecting storing nodes of the memory cells to the bit lines, respectively. The word line is selected by using all of the address signals. For example, the address signals are used only for selecting the word line. In the present invention, all the data amplified simultaneously by the sense amplifiers are inputted/outputted from/to the exterior. Therefore, no address signals are required to select the bit lines and the sense amplifiers. As a result, the number of address signal terminals can be reduced, and the chip size can be also reduced.

According to another aspect of the semiconductor memory of the present invention, in a write operation, a precharge control circuit is disabled before the data is written into the memory cells. That is, it is not necessary that the bit lines be reset to a predetermined voltage during the write operation. According to the present invention, as described above, all the data inputted from the exterior are written into the memory cells during the write operation. Therefore, it is not necessary that part of the data held in the memory cells be rewritten during the write operation. That is, there is no need to precharge the bit lines before the beginning of the write operation. As a result, controlling the precharge operation and controlling the write operation can be made simple. Besides, the write operation time can be shortened.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DETAILED DESCRIPTION OF THE PREFERRED EMBODIMENT

Embodiments of the present invention will be described below with reference to the drawings.

Figure 1:
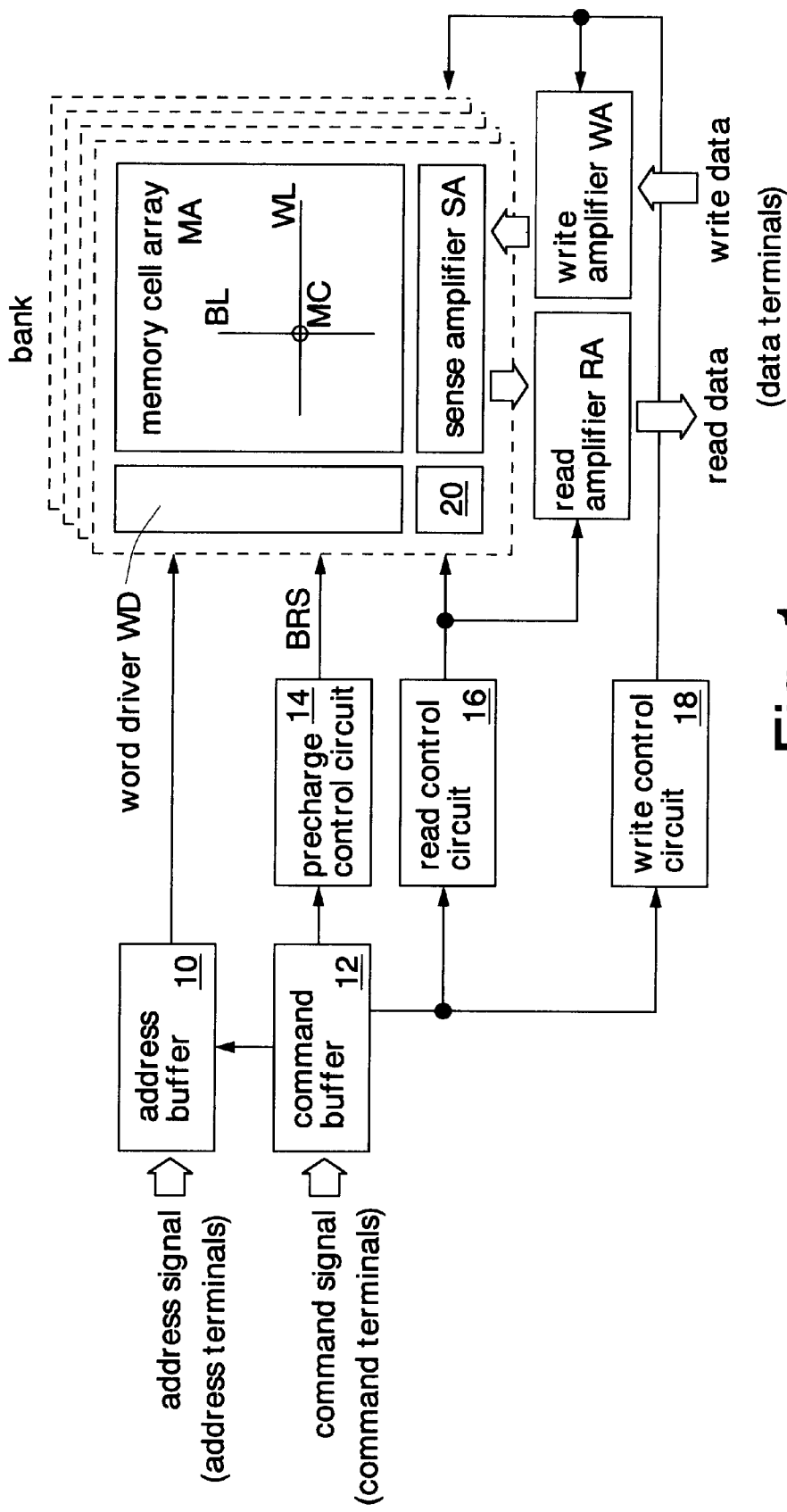
FIG. 1 is a block diagram showing a first embodiment of the present invention.

FIG. 1 shows the essential parts of a first embodiment of semiconductor memory according to the present invention. This semiconductor memory is formed, as a DRAM, on a silicon substrate by use of a CMOS process.

The DRAM includes an address buffer 10, a command buffer 12, a precharge control circuit 14, a read control circuit 16 (a data control circuit), a write control circuit 18 (a data control circuit), read amplifiers RA, and write amplifiers WA for each four banks. The address buffer 10 receives at once the address signals supplied from the exterior of the memory for selecting memory cells MC in synchronization with timing signals from the command buffer 12, and outputs the received address signals to the banks. The command buffer 12 generates timing signals in accordance with command signals (read commands, write commands and so on) supplied from the exterior and outputs these timing signals to the address buffer 10, read control circuit 16 and write control circuit 18.

The precharge control circuit 14 is controlled by the command buffer 12 and outputs to sense amplifiers SA, bit line reset signals BRS for resetting bit lines BL and /BL to predetermined voltages. When receiving a read command, the read control circuit 16 is activated to output a plurality of control signals for operating the banks and read amplifiers RA. When receiving a write command, the write control circuit 18 is activated to output a plurality of control signals for operating the banks and write amplifiers WA.

The banks have word drivers WD, the sense amplifiers SA, sense amplifier control circuits 20 (data control circuits) and memory cell arrays MA. The banks are selected, for example, by bank selection signals (not shown) supplied from the exterior. In the memory cell array MA, there are horizontally and vertically wired a plurality of word lines WL and bit lines BL and /BL, and there are formed memory cells at the intersections of the word lines WL and the bit lines BL and /BL. The word drivers WD select, in response to address signals supplied from the exterior, the corresponding word lines WL The sense amplifier control circuits 20 generate, in response to control signals from the read and write control circuits 16 and 18, control signals for operating the sense amplifiers SA.

Figure 2:
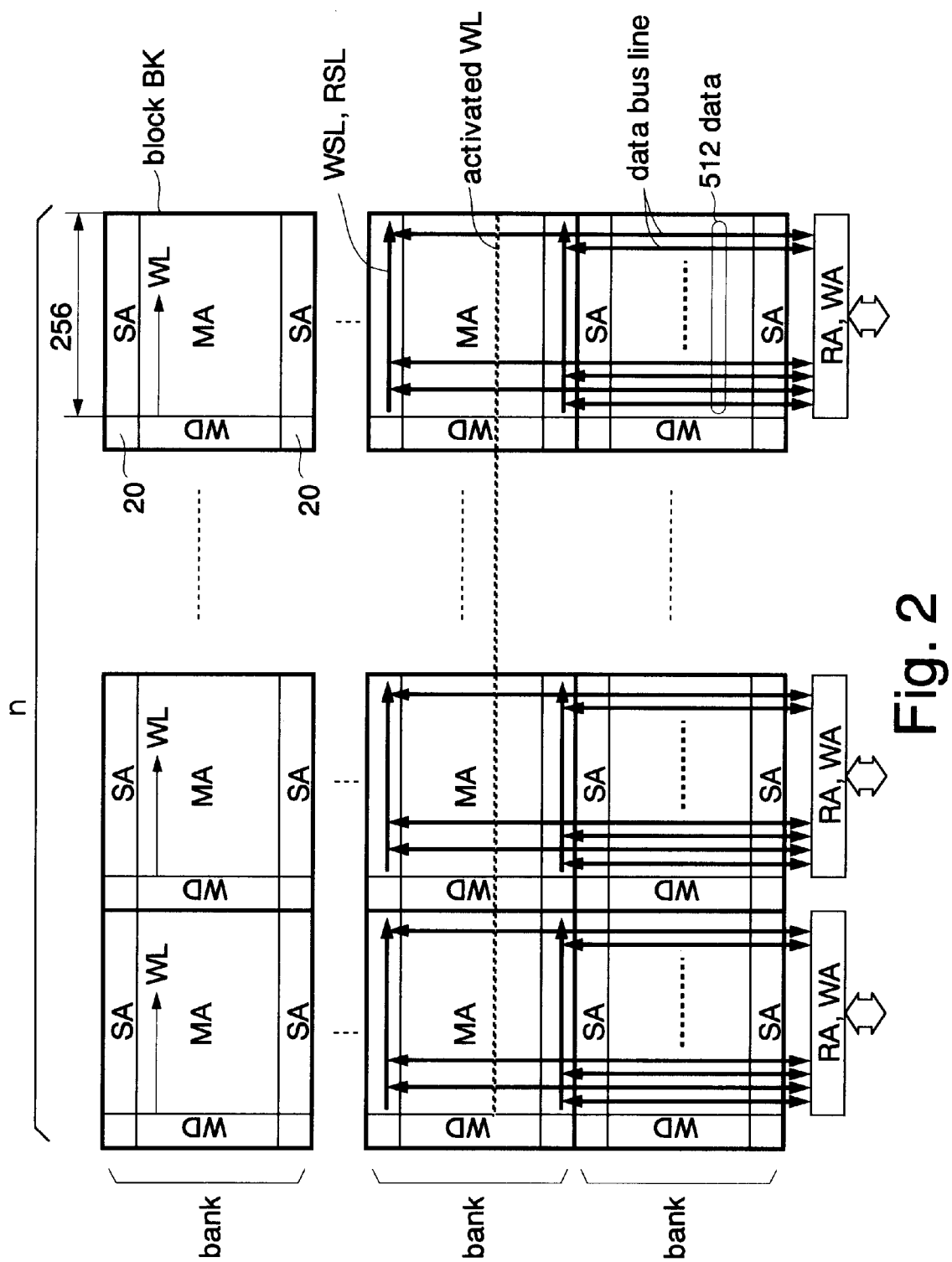
FIG. 2 is a block diagram showing the details of the banks of FIG. 1.

FIG. 2 shows the details of a layout of the banks of FIG. 1. Each bank has word lines WL independently wired every 512 sense amplifiers, and consists of n blocks BK. The word lines WL may be main and sub word lines. The number n of blocks BK may be set to any value equal to or greater than 1, according to the requirements of a DRAM to be developed. In each block BK, 256 sense amplifiers are arranged along both sides of the memory cell array MA (along the upper and lower sides of the memory cell array MA as shown in FIG. 2), and the word driver WD and sense amplifier control circuit 20 are arranged along one side of the memory cell array MA (along the left side of the memory cell array MA as shown in FIG. 2). The sense amplifiers SA are independent every block BK. That is, the sense amplifiers SA are not shared by a plurality of banks. For this reason, according to the present embodiment, a so-called interleave operation (overlap operation) that activates a plurality of banks simultaneously is possible. Besides, since the sense amplifiers SA are independent in every block BK, there is no need of providing any isolation switches that isolate the sense amplifiers SA from the bit lines of the adjacent memory cell arrays MA. In general, the isolation switches are controlled by use of a high voltage. Thus, the elimination of the necessity of such isolation switches can reduce the power consumption.

In the regions of the sense amplifiers SA, there are wired, along the horizontal direction of FIG. 2, SA selection lines WSL and RSL for connecting data bus lines to the bit lines BL (not shown). The signals to be supplied to the SA selection lines WSL and RSL are produced by the sense amplifier control circuits 20. The data bus lines are complementary read data bus lines RDB and /RDB and complementary write data bus lines WDB and /WDB, as will be described later. Using the complementary type of data bus lines can reduce the noise affection on the data bus lines, ensuring the transfer of read and write data within the chip. The separation of the data bus lines into the read and write data bus lines allows the read data and write data to be transferred simultaneously. This makes the access time short, realizing a high-speed access, and also makes the timing design of the input/output data easier than the conventional one. Signals that are transferred by the SA selection lines WSL and RSL will be referred to as switch signals WSL and RSL, respectively, hereinafter. Incidentally, the bit lines BL are wired in the same vertical direction of FIG. 2 as the data bus lines.

In the present embodiment, a bank selection signal is used to select a corresponding predetermined bank. In all the blocks BK of the selected bank, the word lines WL selected by address signals are activated simultaneously. At this moment, n times 512 of data are outputted to the read amplifiers RA or supplied from the write amplifiers WA. That is, all the data corresponding to the activated sense amplifiers SA are outputted/inputted via the external terminals. Thus, the power consumption per bit of the input/output data can be reduced.

Additionally, since all the data corresponding to the activated sense amplifiers SA are inputted/outputted, there is no need to provide any address signals (conventional so-called column address signals) for selecting bit lines and sense amplifiers. That is, address signals (conventional so-called row address signals) are used only for selecting word lines WL For this reason, in a case when the present invention is applied to a DRAM that receives all the address signals at once as in the present embodiment, the number of address signal terminals can be reduced by the bit number of the column address signals. In a case when the present invention is applied to a DRAM where the address signals are supplied with row and column addresses separated, the supply of the column addresses is no longer required, so that the controls related to the column addresses are no longer required.

A data output to the exterior of the DRAM may be effected such that all the data amplified by the sense amplifiers SA are outputted at once or that they are time-divided and then outputted. In either case, the power consumption per unit data transfer can be remarkably reduced as compared to the conventional one.

Figure 3:
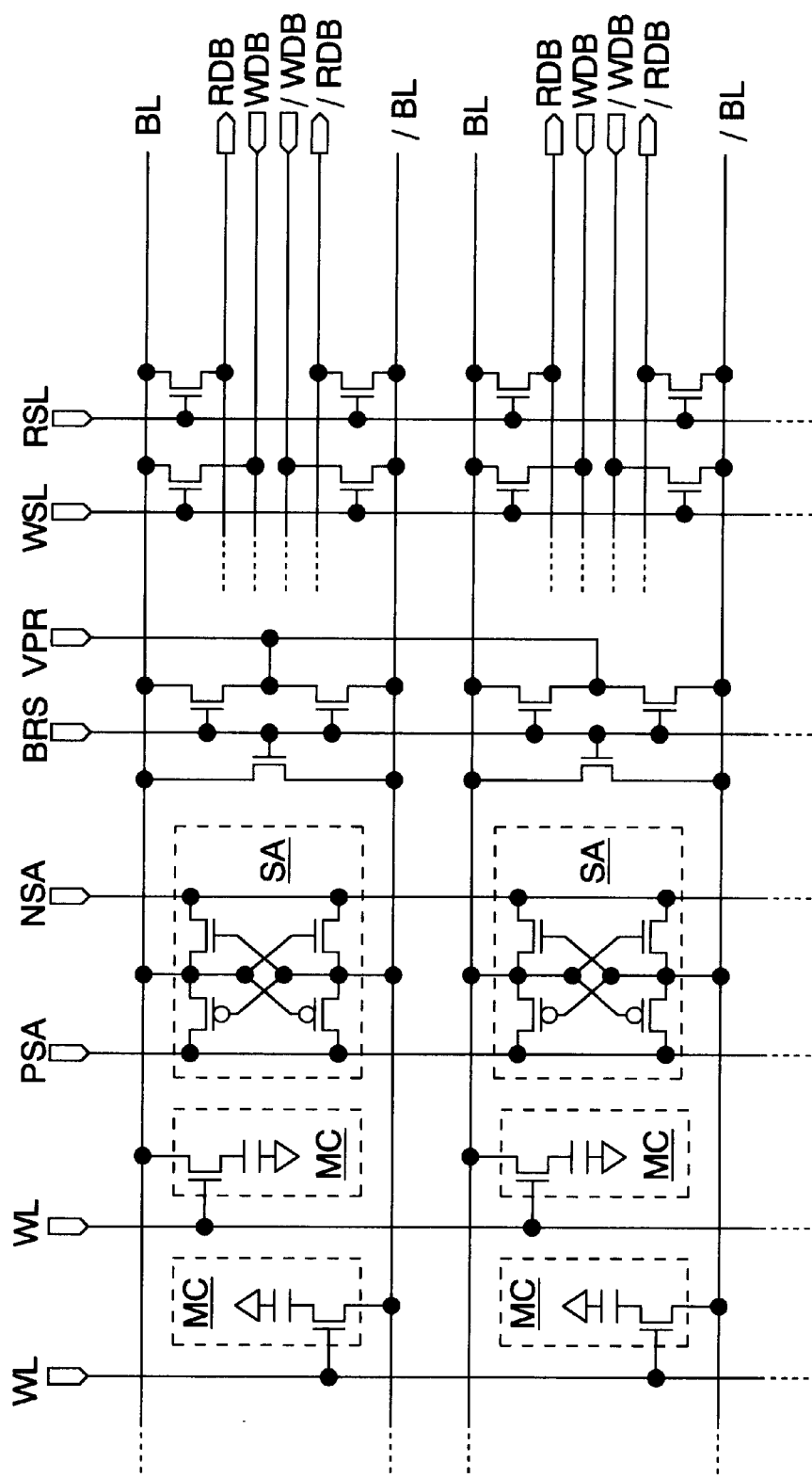
FIG. 3 is a circuit diagram showing the details of the block BK of FIG. 1.

FIG. 3 shows the details of the block BK. The gates of the nMOS transistors in the memory cells MC connected to a plurality of bit lines BL (or /BL) respectively are connected to a word line WL. That is, the connection of the capacitors (storing nodes) of the memory cells MC to the bit lines BL and /BL is controlled. by the word lines WL.

Each of the sense amplifiers SA is formed by connecting input and output terminals of two CMOS inverters. The sources of the pMOS and nMOS transistors of the sense amplifiers SA receive sense amplifier activating signals PSA and NSA, respectively. The pMOS and nMOS transistors will be referred to simply as pMOS and nMOS, respectively, hereinafter.

The complementary bit lines BL and /BL are connected to each other via an equalizing nMOS controlled by a bit line reset signal BRS. The bit lines BL and /BL are also connected to a precharge line VPR via respective nMOSes controlled by the bit line reset signal BRS.

The bit line BL is connected to a read data bus line RDB via an nMOS switch controlled by a switch signal RSL The bit line /BL is connected to a read data bus line /RDB via an nMOS switch controlled by the switch signal RSL. Additionally, the bit line BL is connected to a write data bus line WDB via an nMOS switch controlled by a switch signal WSL, while the bit line /BL is connected to a write data bus line /WDB via an nMOS switch controlled by the switch signal WSL. In this way, read data bus lines RDB and /RDB as a complementary data line pair and write data bus lines WDB and /WDB as a complementary data line pair are formed corresponding to the complementary bit lines BL and /BL, respectively.

The switch signal RSL simultaneously turns on all the nMOS switches in the block BK corresponding to this switch signal RSL The bit lines BL and /BL are simultaneously connected to the read data bus lines RDB and /RDB. Similarly, the switch signal WSL simultaneously turns on all the nMOS switches in the block BK corresponding to this switch signal WSL The bit lines BL and /BL are simultaneously connected to the write data bus lines WDB and /WDB. In other words, the switch signals RSL and WSL connect the data bus lines to all the bit lines corresponding to the memory cells MC selected by the word line WL, respectively. In the present embodiment, since there is no need to control the nMOS switches for each sense amplifier SA, the nMOS switches can be easily controlled. Besides, since what is needed is to connect the complementary signal lines to each other (e.g., the bit line BL to the read data bus line RDB), simple nMOS switches can be employed. Incidentally, the switch signals RSL and WSL turn to a high level in response to the activation of a sense amplifier SA. At this moment, the nMOS switches are turned on.

In FIG. 3, for example, when the word line WL on the right side of FIG. 3 is selected during a read operation, the data transferred from the memory cell MC to the bit line BL is amplified by the sense amplifier SA. The level of the bit line /BL is reverse to that of the data held by the memory cell MC connected to the bit line BL Then, the voltage difference between the complementary bit lines BL and /BL is transferred through the nMOSes controlled by the switch signal RSL to the complementary read data bus lines RDB and /RDB and then outputted to the exterior of the memory as read data.

Figure 4:
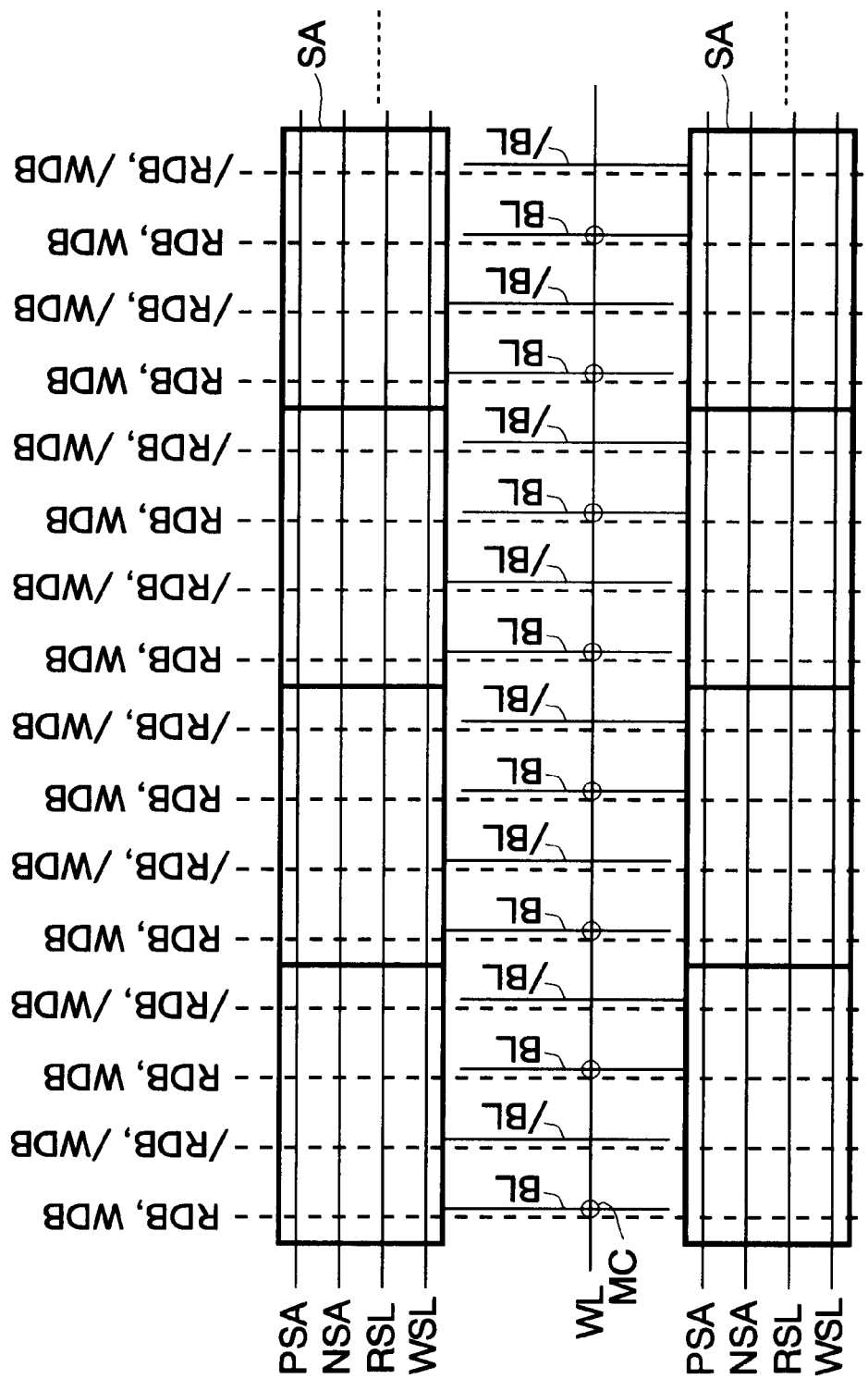
FIG. 4 is a layout diagram of the read and write data bus lines.

During a write operation, the write data supplied via the complementary write data bus lines WDB and /WDB is transferred to the bit lines BL and /BL via the nMOSes controlled by the switching signal WSL The transferred write data is amplified by the sense amplifier SA and then written, by use of one of the bit lines BL and /BL, into the memory cell MC selected by the word line WL FIG. 4 shows an outline of the layout of the read data bus lines RDB and /RDB and write data bus lines WDB and /WDB. In the present embodiment, since all the data amplified by the sense amplifiers SA are inputted/outputted, the read data bus lines RDB and /RDB and write data bus lines WDB and /WDB are formed corresponding to all the respective bit lines BL and /BL, as shown in FIG. 3. In this example, all the illustrated sense amplifiers SA are activated simultaneously. To facilitate the layout of the wiring, the read data bus lines RDB and /RDB and write data bus lines WDB and /WDB are formed along the wiring direction of the bit lines BL and /BL.

The switch signal RSL (or WSL) simultaneously connect the bit lines BL and /BL corresponding to a plurality of sense amplifiers SA to the read data bus lines RDB and /RDB (or the write data bus lines WDB and /WDB). For this reason, the wiring of the switch signals RSL and WSL (SA selection lines) are formed along the direction of alignment of the sense amplifiers SA. Similarly, the wiring of the sense amplifier activating signals PSA and NSA that simultaneously activate the plurality of sense amplifiers SA are formed along the direction of alignment of the sense amplifiers SA.

Figure 5:
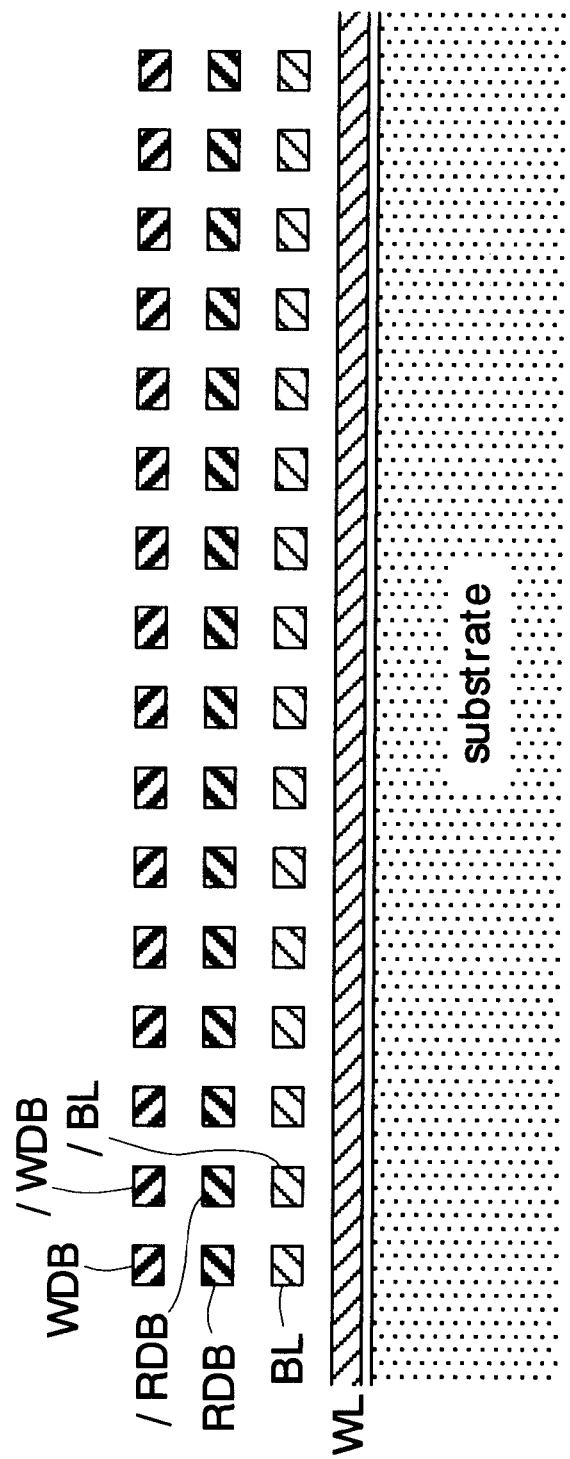
FIG. 5 is a diagram showing a cross-sectional view taken along the word line of FIG. 4.

FIG. 5 shows a cross-sectional view taken along the word line WL of FIG. 4. The DRAM of the present embodiment has four wiring layers. These wiring layers will be referred to, in the order from the nearest to the farthest with respect to the substrate, as first, second, third and fourth wiring layers hereinafter. The word lines WL are formed by use of the first wiring layer made of polysilicon or the like. The bit lines BL and /BL are formed by use of the second wiring layer. The read data bus lines RDB and /RDB are formed by use of the third wiring layer. The write data bus lines WDB and /WDB are formed by use of the forth wiring layer. The second, third and fourth wiring layers are made of a conductive material, such as aluminum, tungsten, copper or the like.

The wiring width and wiring pitch of the read data bus lines RDB and /RDB and write data bus lines WDB and /WDB are equalized to the wiring width and wiring pitch of the bit lines BL and /BL. That is, the wiring pitch of the read data bus lines RDB and /RDB and write data bus lines WDB and /WDB is established to be equal to an integral multiple of the wiring pitch of the bit lines BL and /BL This establishment realizes a wire alignment and hence facilitates the layout design, the layout verification, the device process design and so on. This facilitation can reduce the development cost and shorten the development time.

Figure 6:
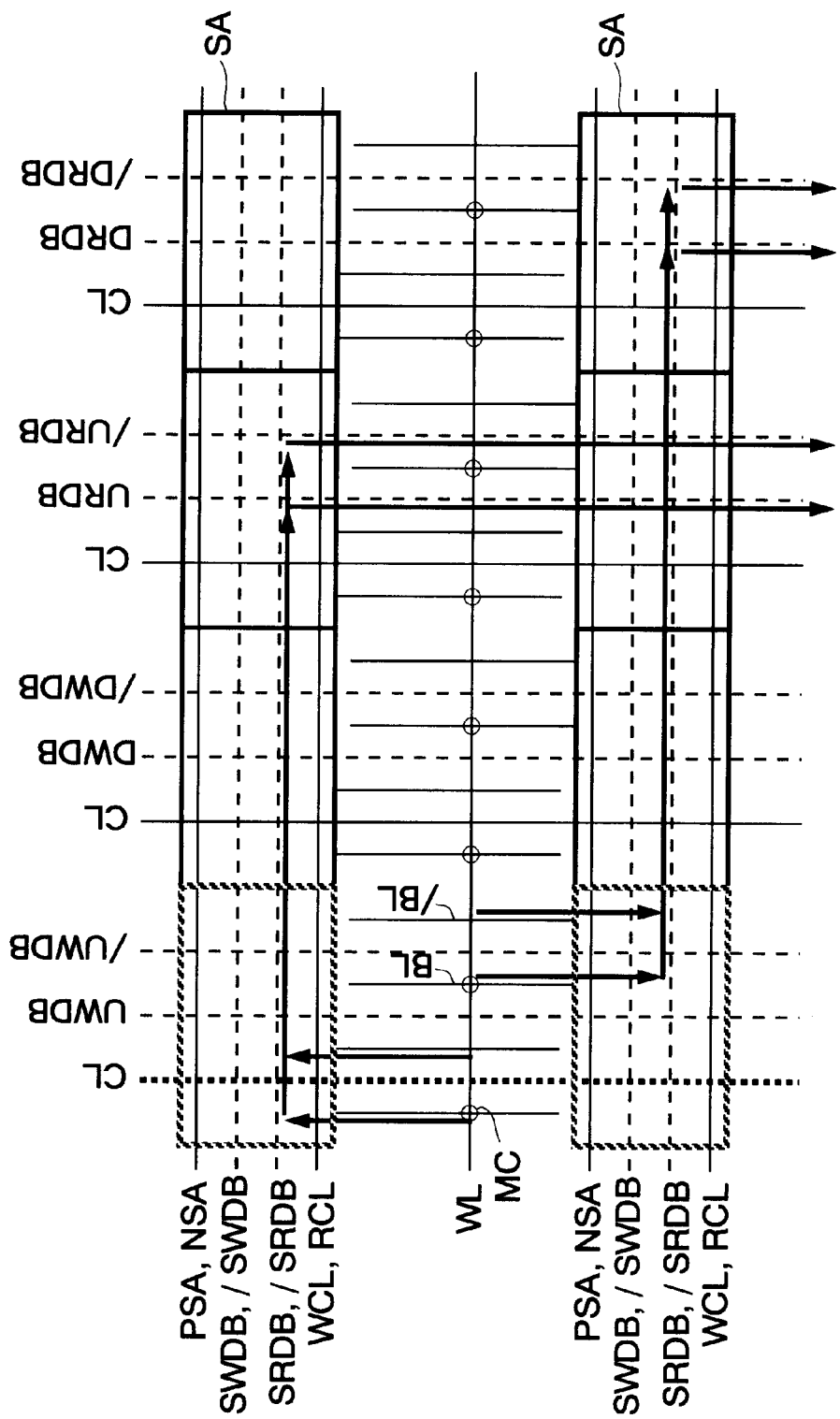
FIG. 6 is a layout diagram showing the data bus lines the inventor of the present invention considered before inventing the present invention.

FIG. 6 shows an outline of the layout of the data bus lines of the conventional memory (DRAM), which is not publicly known. In this layout, only some of the sense amplifiers SA simultaneously activated contribute to the data inputting/outputting. For this reason, along the direction of alignment of the sense amplifiers SA, there are wired sub read data bus lines SRDB and /SRDB and sub write data bus lines SWDB and /SWDB common to the sense amplifiers SA. Besides, along the wiring direction of bit lines BL and /BL, there are wired main read data bus lines URDB, /URDB, DRDB, and /DRDB and main write data bus lines UWDB, /UWDB, DWDB, and /DWDB common to the sense amplifiers SA. The initial letters "U" and "D" of these main read data bus lines URDB, /URDB, DRDB, and /DRDB and main write data bus lines UWDB, /LWDB, DWDB, and /DWDB indicate that these are corresponding to the sense amplifiers SA, respectively, shown on the upper and lower side of FIG. 6.

The bit lines BL and /BL and sub read data bus lines SRDB and /SRDB are connected to each other by a switch signal RCL common to the sense amplifiers SA aligned in the horizontal direction of FIG. 6 and by a switch signal CL common to the sense amplifiers SA aligned in the vertical direction of FIG. 6. The switch signals RCL and CL are supplied to the respective gates of two transistors coupled in series. A simultaneous turning-on of these transistors connects the bit lines BL and /BL to the sub read data bus lines SRDB and /SRDB. For example, the switch signal CL selects two sense amplifiers SA among sixteen activated sense amplifiers SA.

In a read operation, the data read from the memory cells onto the bit lines BL (or /BL) are amplified by all the sense amplifiers SA in the block. Then, the switch signal CL corresponding to a column address signal (e.g., "CL" indicated by bold dotted line on the left side of FIG. 6) is selected. Then, as shown by arrows in FIG. 6, only the data selected by the switch signal CL, out of the data amplified by the sense amplifiers SA indicted by bold dotted lines, are transferred to the sub read data bus lines SRDB and /SRDB and main read data bus lines URDB and DRDB and then outputted to the exterior.

Figure 7:
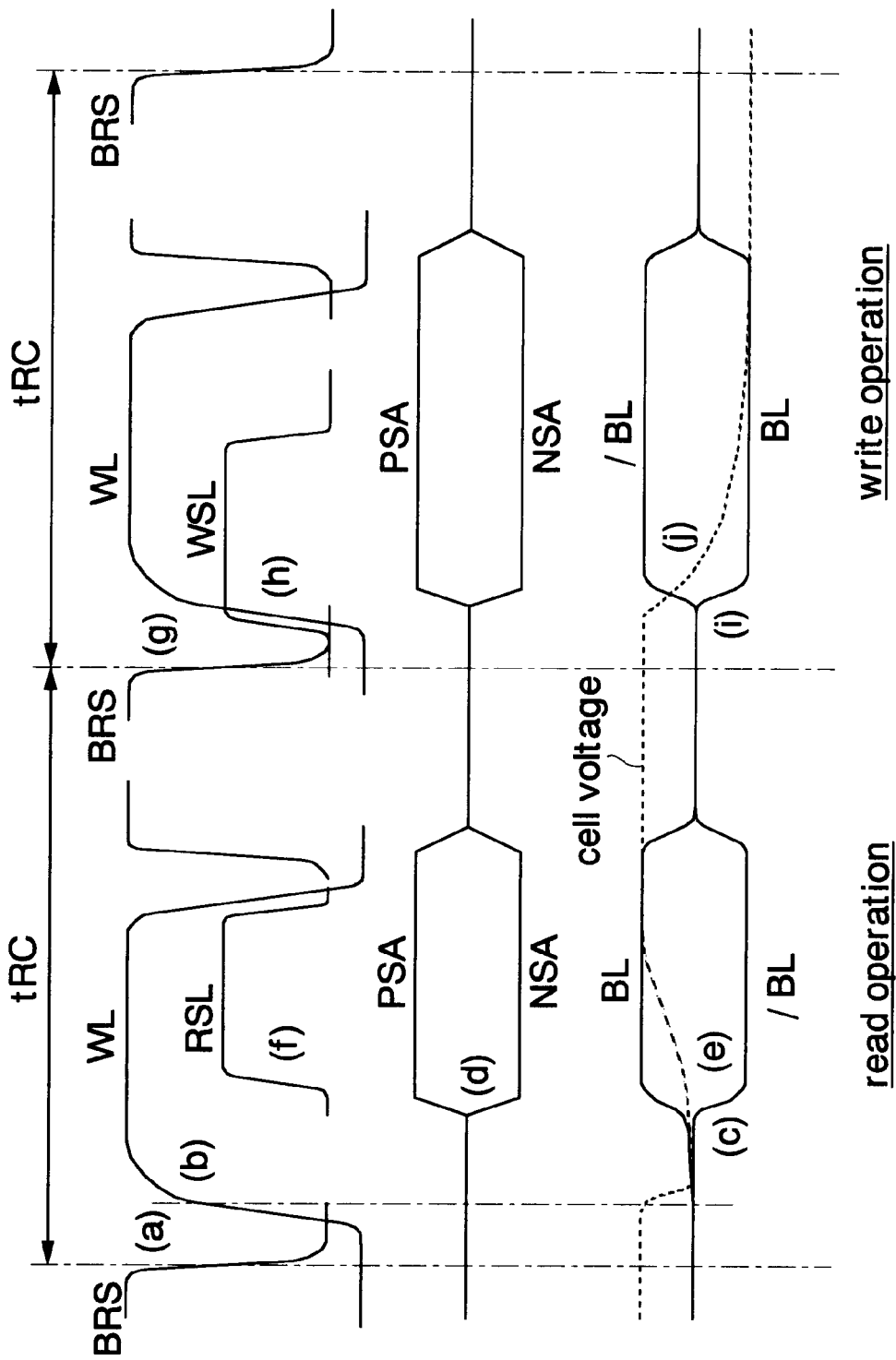
FIG. 7 is a timing diagram showing the read and write operations of the first embodiment.

FIG. 7 shows the read and write operations of the DRAM of the present invention. In FIG. 7, for a better understanding, the interval between the falling edges of the bit line reset signal BRS is shown as a cycle time tRC. The bit line reset signal BRS, switch signals RSL and WSL, sense amplifier activating signals PSA and NSA are generated by the data control circuits (the read control circuit 16, write control circuit 18 and sense amplifier control circuits 20).

During a read operation, first of all, the bit line reset signal BRS turns to a low level, terminating the precharge of the pairs of bit lines BL and /BL (FIG. 7(a)). Then, in accordance with address signals simultaneously supplied from the exterior of the DRAM, the predetermined word line WL is selected (FIG. 7(b)), and data are read from memory cells MC onto the bit lines BL (or /BL) (FIG. 7(c)). Next, the sense amplifier activating signals PSA and NSA turn to a high level and a low level, respectively, activating all the sense amplifiers SA in a bank as shown in FIG. 2 (FIG. 7(d)). This activation of the sense amplifiers SA causes the respective voltage differences between the bit lines BL and /BL to be amplified (FIG. 7(e)).

Thereafter, the switch signal RSL is activated (FIG. 7(f)), causing the bit lines BL and /BL and read data bus lines RDB and /RDB to be connected to each other, respectively. The levels of the bit lines BL and /BL are outputted through the read data bus lines RDB and /RDB and through the read amplifiers RA shown in FIG. 2 to the exterior.

Thereafter, the switch signal RSL, word line WL and sense amplifier activating signals PSA and NSA are sequentially inactivated. The bit line reset signal BRS is inactivated, and the pairs of bit lines BL and /BL are precharged (equalized), resulting in a termination of the read operation.

During a write operation, the bit line reset signal BRS turns to a low level, and the precharge of the pairs of bit lines BL and /BL is terminated (FIG. 7(g)). Then, the switch signal WSL is activated (FIG. 7(h)), and the write data supplied from the exterior of the DRAM are transferred through the write amplifiers WA shown in FIG. 2 and through the write data bus lines WDB and /WDB to the bit lines BL and /BL (FIG. 7(i). At this moment, the sense amplifiers SA have not yet been activated, and the word line WL has not yet been selected. Immediately after the write data has been transferred to the bit lines BL and /BL, the word line WL is activated. Then, all the sense amplifiers SA in the bank are activated, and all the write data amplified by the sense amplifiers SA are written into the memory cells MC (FIG. 7.(j)).

Thus, the write data from the exterior are transferred to the bit lines BL and /BL before the data held in the memory cells MC are transferred to the bit lines BL (or /BL). Also, the write data from the exterior are transferred to the bit lines BL and /BL before the sense amplifiers SA are activated.

In the present embodiment, since all the data amplified by the sense amplifiers SA are inputted/outputted, no time period for rewriting data into the memory cells MC is required. For this reason, the write time can be shortened. As a result, the cycle times tRC of the read and write operations can be shortened. Additionally, since no data read and rewrite processes are required, the noise affections received from the adjacent bit lines BL and /BL are small.

Figure 8:
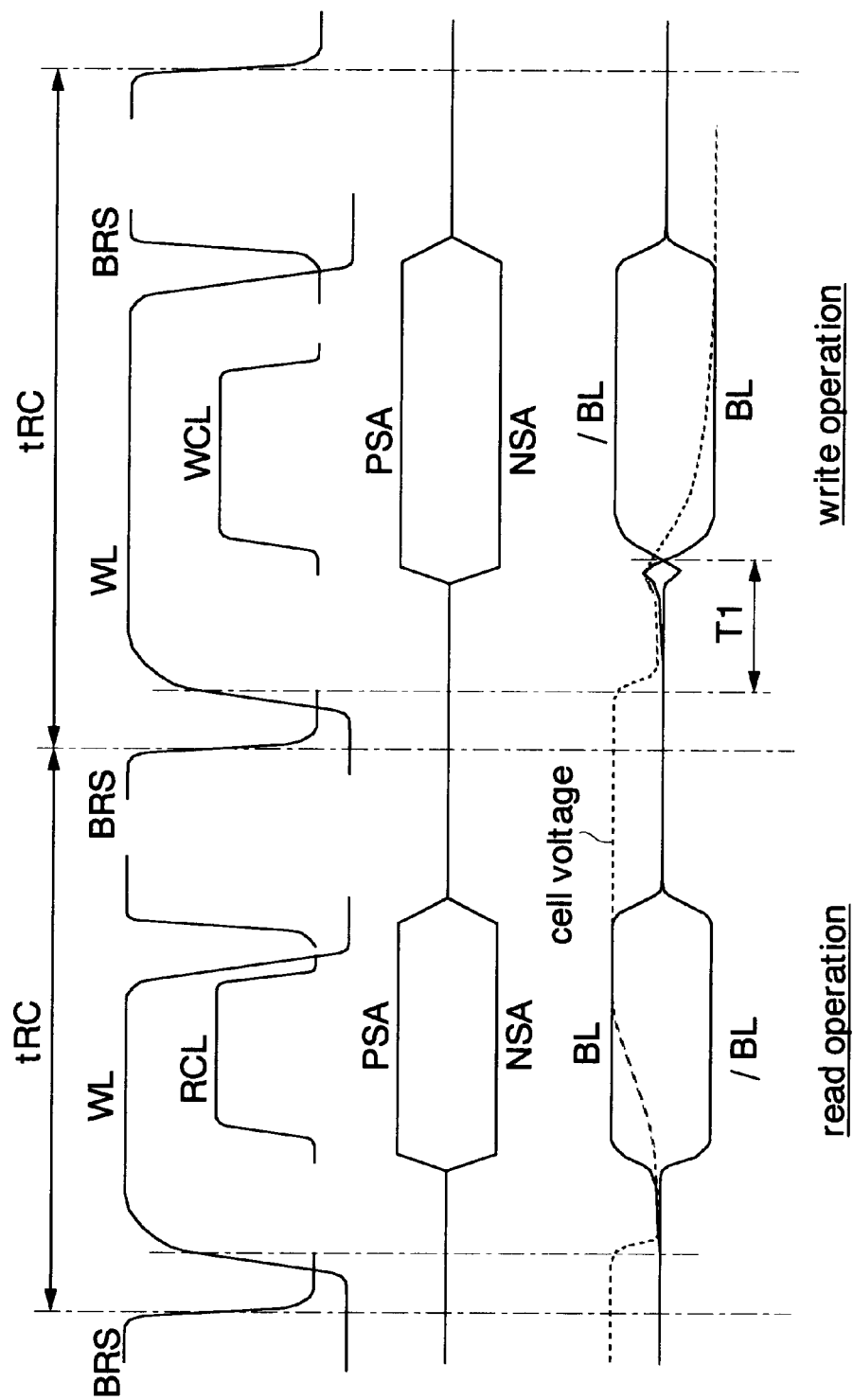
FIG. 8 is a timing diagram showing the read and write operations the inventor of the present invention considered before inventing the present invention.

FIG. 8 shows, as an example for comparison, the schematic waveform of the read and write operations of a conventional DRAM, which represents the same operation as FIG. 7, low-data-write after high-data-read, and which is not publicly known. The read operation is the same as that of FIG. 7, and hence its explanation is omitted. In the write operation, many of the activated sense amplifiers SA operate for rewriting the data read from the memory cells MC. For this reason, a time period T1 is required in which the data held in the memory cells MC is transferred to the bit lines BL (or /BL) and then the level of the bit lines BL (or /BL) becomes such a level that can be amplified and rewritten by the sense amplifiers SA. Thus, the time period T1 has to be included in the cycle time tRC. In other words, according to the present invention, the write operation time can be shortened by the duration of the time period T1.

For the purpose of comparison with the present invention, the read and write operations have different cycle times tRC in FIG. 8. In practical DRAMs, however, the cycle times tRC of the read and write operations are generally established to be equal to each other so as to enhance the usability. For this usability enhancement, there is a need to extend the cycle time tRC of the read operation in accordance with the cycle time tRC of the write operation. In contrast, according to the present invention, since the time period T1 in the write operation is not necessary, the read and write operations can have equal cycle times tRC. In addition, the cycle time tRC of the read operation can only depend on the circuit operation required for the read operation.

Thus, according to the present embodiment, since all the data amplified by the sense amplifiers SA are inputted/outputted from/to the exterior, the data transfer rate of the input/output data can be improved, and the power consumption per unit amount of transferred data can be reduced.

Since the read and write data bus lines RDB, /RDB, WDB, and /WDB are wired along the wiring direction of the bit lines BL and /BL, the wiring layout of these data bus lines can be easily performed.

Since the wiring pitch of the read and write data bus lines RDB, /RDB, WDB, and /WDB is established to be equal to an integral multiple of the wiring pitch of the bit lines BL and /BL, the layout design, layout verification, device process design and so on can be easily performed. As a result, the development cost can be reduced, and the development time can be shortened.

Since the data bus lines are separated into the read data bus lines RDB and /RDB for read operation and the write data bus lines WDB and /WDB for write operation, the read and write data can surely be transferred without collision within the chip even under tight timing conditions, and the access time can be shortened, resulting in a high speed access.

Since all the data amplified by the sense amplifiers SA are inputted/outputted from/to the exterior, no rewriting of the data into the memory cells is required during the write operation. For this reason, the write operation can be performed at a relatively high speed as compared with the prior art.

Since all the address signals are received at once during the read operation and during the write operation, the control of the address signals within the chip can be easily performed. Besides, since all the data amplified by the sense amplifiers SA are inputted/outputted from/to the exterior, no address signals for selecting the bit lines and sense amplifiers are required, and the address signals are used only for selecting the word lines WL As a result, the number of address signal terminals can be reduced, and the chip size can be reduced.

Thus, low power consumption, a high bus bandwidth, and a high-speed operation can be realized at the same time. Therefore, if the present invention is applied especially to a semiconductor memory used for a portable device having an image processing function, it can provide a high efficiency. Besides, if the present invention is applied to a semiconductor memory used in a system LSI having small limited bus widths, it also can provide a high efficiency.

Figure 9:
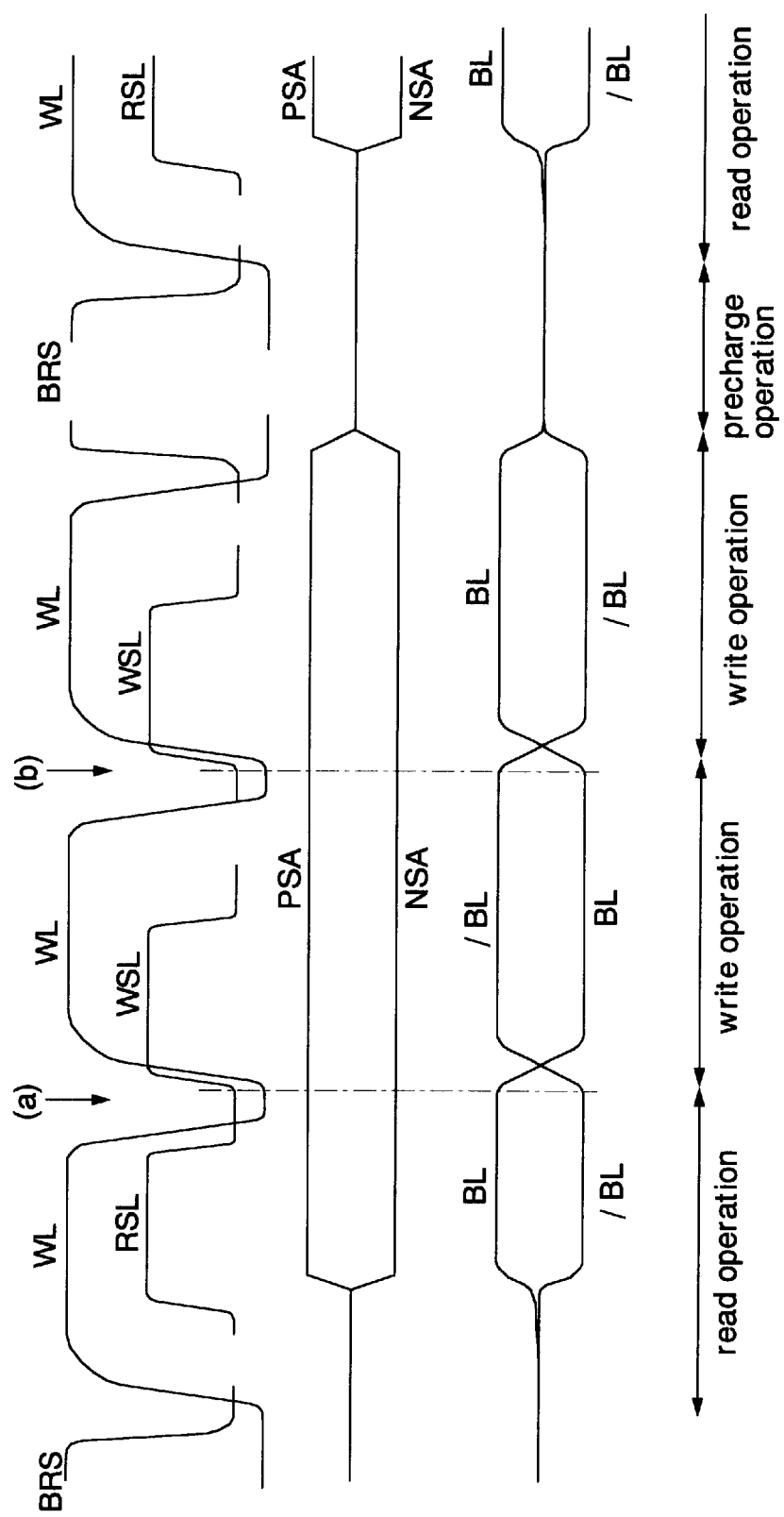
FIG. 9 is a timing diagram showing a second embodiment of the present invention.

FIG. 9 shows the timings of a second embodiment of semiconductor memory according to the present invention. In this embodiment, elements corresponding to the same elements in the first embodiment are identified by the same reference designations, and their detailed explanations are omitted.

The second embodiment is characterized by the precharge control circuit (FIG. 1) for precharging the bit lines BL and /BL. That is, no precharge operation is executed before the write operation. The basic circuit structure of the second embodiment is the same as that of the first embodiment (FIGS. 1 and 2). That is, in the semiconductor memory of the second embodiment, all the data amplified by the sense amplifiers SA are inputted/outputted from/to the exterior.

As shown in FIG. 9, the bit lines BL and /BL are precharged only before the read operation (a high level period of the bit line reset signal BRS). Before a start of the write operation (FIGS. 9(a) and (b)), the bit line reset signal BRS keeps a low level, and the sense amplifier activating signals PSA and NSA are activated. That is, before the write operation, no precharge operation is executed, and the sense amplifiers SA are kept activated. According to the present invention, since the write data are written into all the memory cells MC selected by the word line WL, the data already stored in the memory cells MC need not be held. That is, rewriting the data into the memory cells MC (a kind of refresh operation) is not necessary. For this reason, at the time of starting the write operation, there is no need to perform the precharge operation, which is a preliminary process for reading onto the bit lines BL (or /BL) the data stored in the memory cells MC.

In the conventional write operation, the write data are transferred only to part of the bit lines BL and /BL connected to activated sense amplifiers SA. On the rest of the bit lines BL and /BL, the data to be rewritten are amplified. That is, most of the data read from the memory cells selected by the word line have to be surely rewritten back into the memory cells. Accordingly, it is necessary to precisely precharge a predetermined voltage to the bit lines corresponding to the memory cells the data are read from.

The present embodiment can provide the same or similar effects as the foregoing first embodiment. Additionally, according to the present embodiment, since the precharge operation prior to the write operation is not required, the cycle time tRC of the write operation can be further shortened. Since the average number of times of accessing the memory cells MC within a predetermined time period is increased, the data transfer rate is improved. Besides, since there is no need to frequently charge and discharge the bit lines BL and /BL, the power consumption during the operations can be reduced.

Figure 10:
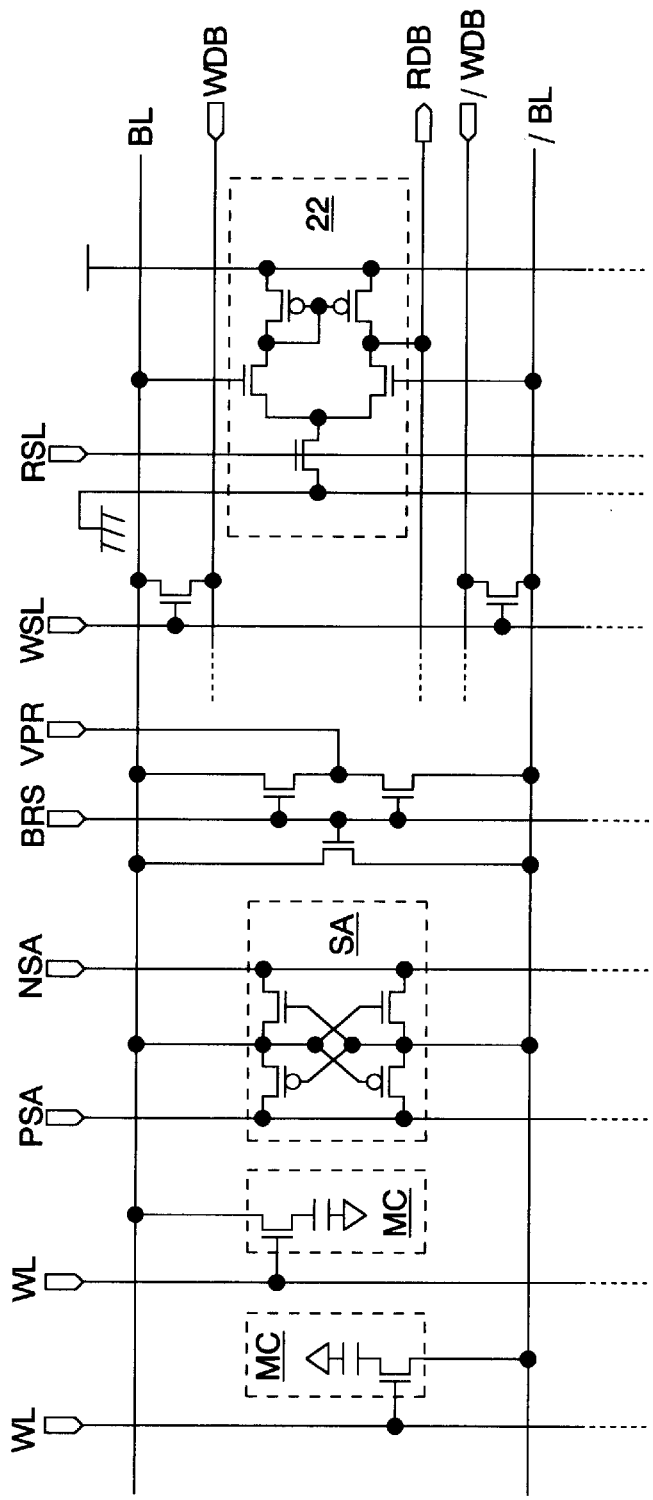
FIG. 10 is a circuit diagram showing the essential parts of a third embodiment of the present invention.

FIG. 10 shows the essential parts of a third embodiment of semiconductor memory according to the present invention. In this embodiment, elements corresponding to the same elements in the first embodiment are identified by the same reference designations, and their detailed explanations are omitted.

The third embodiment is characterized by using a single-phase read data bus line RDB. That is, the complementary write data bus lines WDB and /WDB and the single-phase read data bus line RDB are connected to the bit lines BL and /BL. The other structural parts are the same as those of the foregoing first embodiment.

The write data bus lines WDB and /WDB are connected to the bit lines BL and /BL, respectively, via the respective nMOS switches controlled by the switch signal WSL in the same manner as in the foregoing first embodiment (FIG. 3). The read data bus line RDB is connected through a differential amplifier 22 to the bit lines BL and /BL.

The differential amplifier 22 has a current mirror portion, a differential input portion, and a power supply connection portion. The current mirror portion includes two pMOSes whose sources are connected to a power supply line. The differential input portion includes nMOSes connected to the respective drains of the pMOSes. The power supply connection portion includes an nMOS that connects the differential input portion to a ground line. The bit lines BL and /BL are connected to the differential input portion. The read data bus line RDB is connected to the drain of the nMOS whose gate is connected to the bit line /BL. The gate of the nMOS of the power supply connection portion receives the switch signal RSL.

When the switch signal RSL is a high level, the differential amplifier 22 is activated to amplify the voltage difference between the bit lines BL and /BL (the level of the data read from a memory cell MC) and transfers the amplified voltage difference to the read data bus line RDB. Incidentally, an inverter may be provided to receive the data on the read data bus line RDB, depending on the magnitude of the amplitude of the read data required within the chip.

The present embodiment also can provide the same or similar effects as the foregoing first embodiment. Besides, since the present embodiment employs the single-phase read data bus lines RDB, the number of data bus lines can be reduced. That is, the area of the layout of the data bus lines can be reduced.

Figure 11:
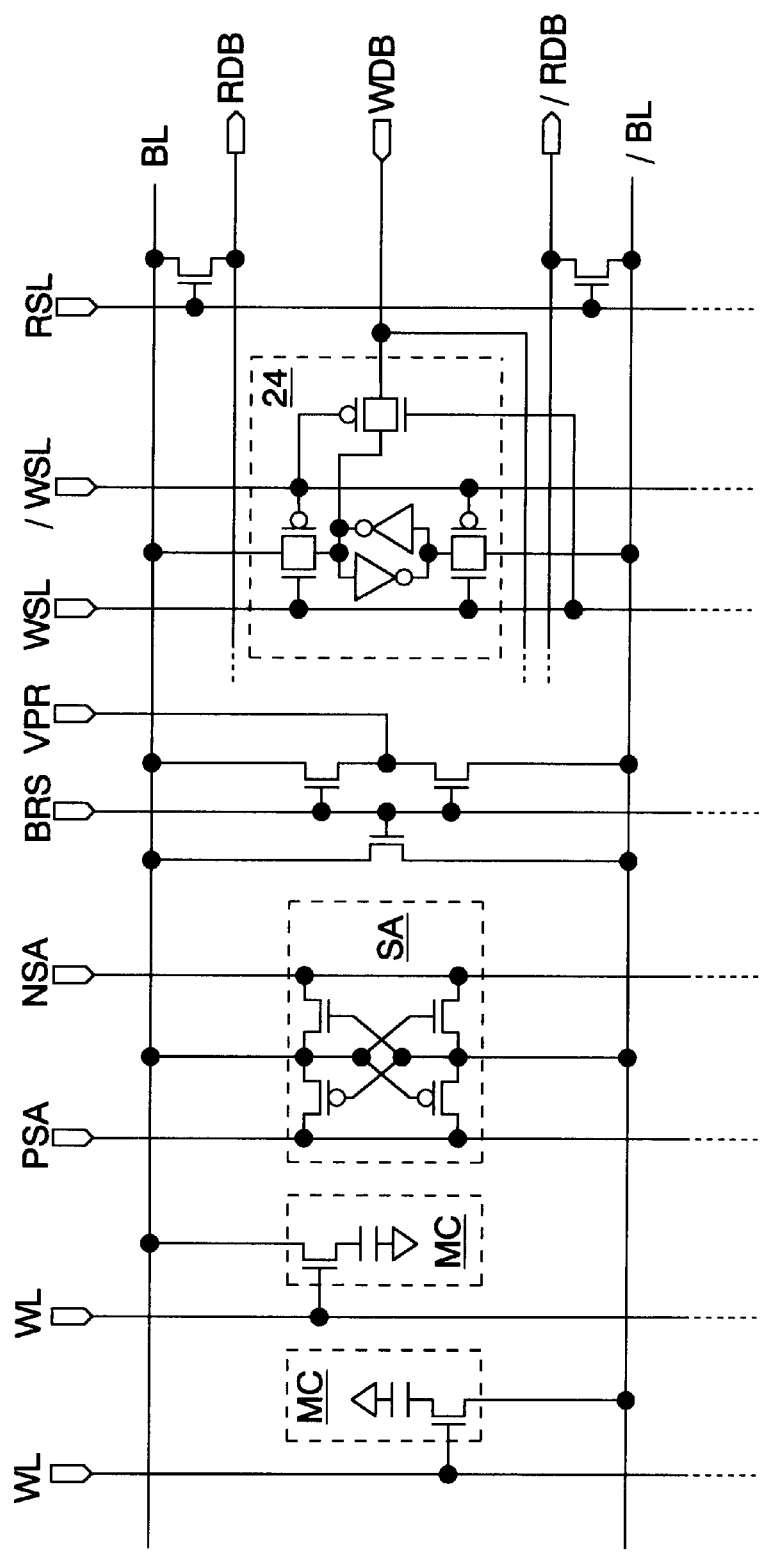
FIG. 11 is a circuit diagram showing the essential parts of a fourth embodiment of the present invention.

FIG. 11 shows the essential parts of a fourth embodiment of semiconductor memory according to the present invention. In this embodiment, elements corresponding to the same elements in the first embodiment are identified by the same reference designations, and their detailed explanations are omitted.

The fourth embodiment is characterized by using a single-phase write data bus line WDB. That is, the complementary read data bus lines RDB and /RDB and the single-phase write data bus line WDB are connected to the bit lines BL and /BL The other structural parts are the same as those of the foregoing first embodiment.

The read data bus lines RDB and /RDB are connected to the bit lines BL and /BL, respectively, via the respective nMOS switches controlled by the switch signal RSL in the same manner as in the foregoing first embodiment (FIG. 3). The write data bus line WDB is connected through an input/output circuit 24 to the bit lines BL and /BL.

The input/output circuit 24 has a latch and CMOS transfer gates. The latch includes two inverters whose inputs and outputs are mutually connected. Those CMOS transfer gates connect the bit line BL to the latch, the bit line /BL to the latch, and an output of the latch (a node whose level is the same as that of the bit line BL) to the write data bus line WDB.

During a write operation, switch signals WSL and /WSL change up to a high level and down to a low level, respectively, turning on the CMOS transfer gates. Then, the write data from the exterior is written into the memory cell MC via the single-phase write data bus line WDB and bit line BL (or /BL).

The present embodiment also can provide the same or similar effects as the foregoing first and third embodiments.

Figure 12:
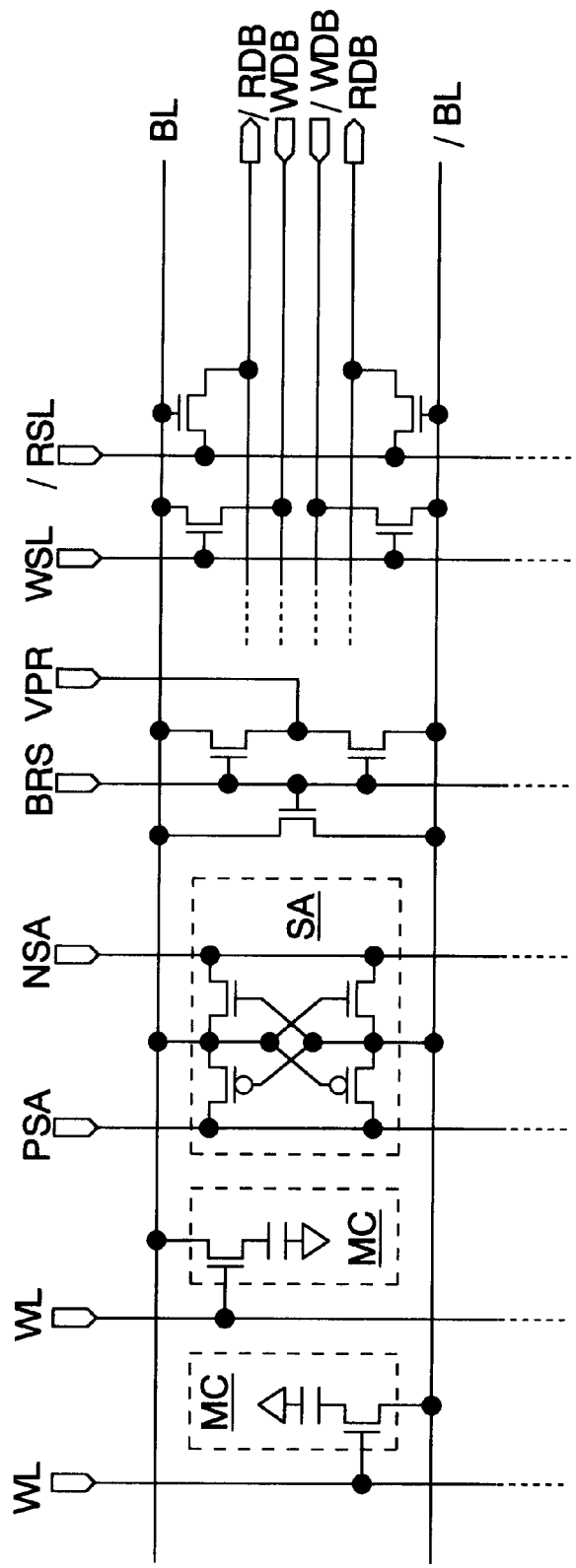
FIG. 12 is a circuit diagram showing the essential parts of a fifth embodiment of the present invention.

FIG. 12 shows the essential parts of a fifth embodiment of semiconductor memory according to the present invention. In this embodiment, elements corresponding to the same elements in the first embodiment are identified by the same reference designations, and their detailed explanations are omitted.

The fifth embodiment is characterized by a circuit for connecting the read data bus lines RDB and /RDB to the bit lines /BL and BL That is, nMOSes that connect the read data bus lines RDB and /RDB to the bit lines BL and /BL, respectively, have their respective gates connected to the bit lines /BL and BL, ones of their respective sources and drains connected to the read data bus lines RDB and /RDB, and the others thereof connected to the switch signal /RSL A method for controlling the nMOS gates by use of the.potentials of the bit lines BL and /BL in this way is called "direct sense" method. The other structural parts are the same as those of the foregoing first embodiment.

According to the direct sense method, the bit lines BL and /BL are not directly connected to the read data bus lines /RDB and RDB. For this reason, even if the switch signal /RSL is activated before the data read from the memory cells MC have been completely amplified, the data on the bit lines are not destroyed, and the read operation is appropriately executed. For this reason, the direct sense method is suitable for a high-speed operation.

The present embodiment also can provide the same or similar effects as the foregoing first and third embodiments. That is, the semiconductor memory employing the direct sense method also can provide the same or similar effects.

Figure 13:
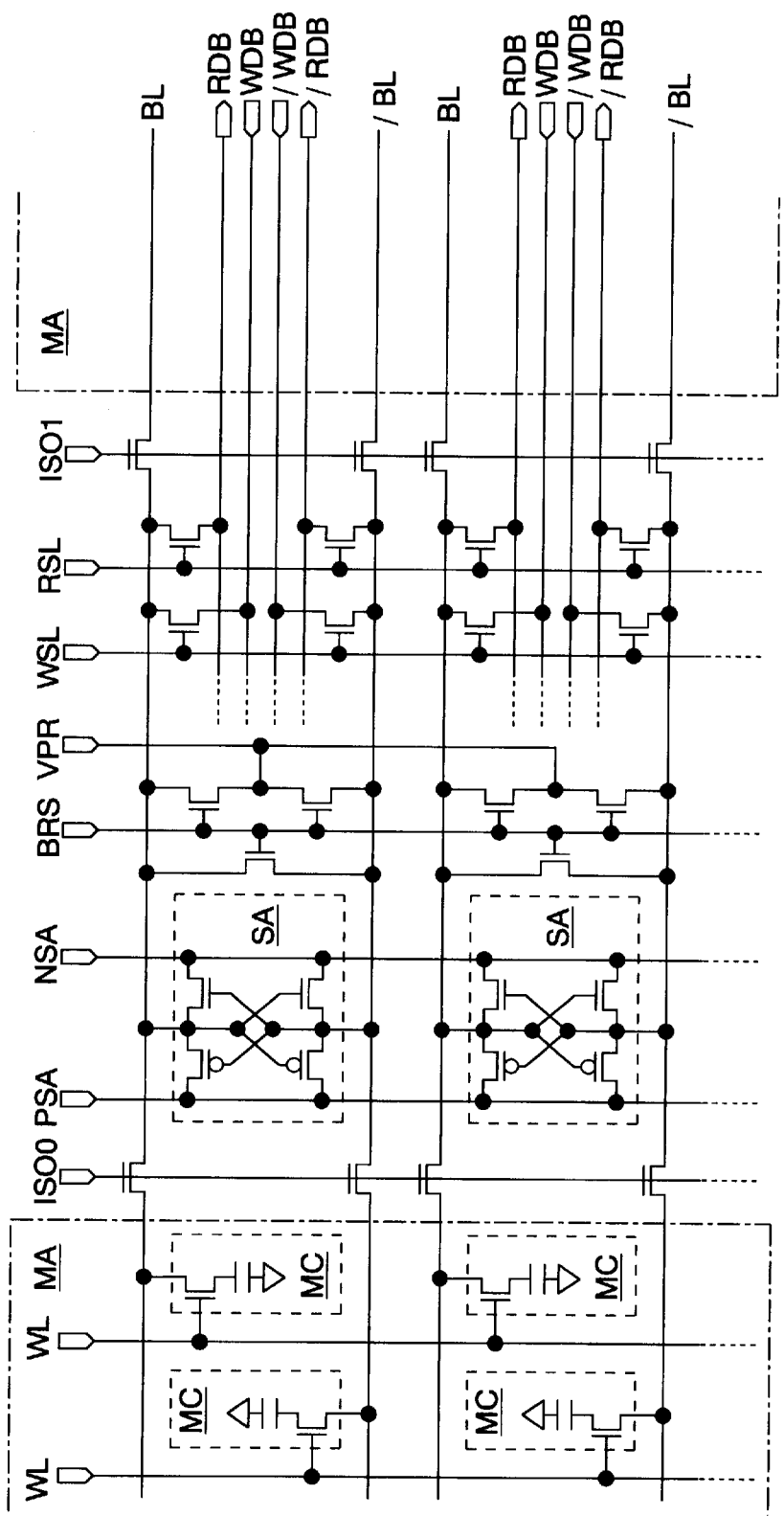
FIG. 13 is a circuit diagram showing the essential parts of a sixth embodiment of the present invention.

FIG. 13 shows the essential parts of a sixth embodiment of semiconductor memory according to the present invention. In this embodiment, elements corresponding to the same elements in the first embodiment are identified by the same reference designations, and their detailed explanations are omitted.

The sixth embodiment is characterized in that the sense amplifiers SA each are shared with a plurality of memory cell arrays MA. The other structural parts are the same as those of the foregoing first embodiment. As shown in FIG. 13, the bit lines BL and /BL of the memory cell arrays MA are connected to the sense amplifiers SA via isolation switches (nMOSes) controlled by isolation signals ISO0 and ISO1.

The isolation switches associated with the memory cell array MA on the left side of FIG. 13 are controlled by the isolation signal ISO0, while those associated with the memory cell array MA on the right side of FIG. 13 are controlled by the isolation signal ISO1. The isolation switches connect the memory cell array MA that is to perform a read or write operation to the sense amplifiers SA.

The present embodiment also can provide the same or similar effects as the foregoing first embodiment.

The foregoing embodiments were described by way of example with the present invention applied to a DRAM. The present invention is not limited to such embodiments. For example, the present invention also may be applied to a clock synchronization type of SDRAM or SRAM. Besides, the present invention also may be applied to a DRAM core used in a system LSI. In such a case, the power consumption per unit amount of input/output data of the DRAM core (unit amount of data transfer) can be reduced.

The foregoing embodiments were described by way of example with the present invention applied to a DRAM having four banks. The present invention is not limited to such embodiments. For example, the present invention also may be applied to a DRAM in which no banks are formed.

The foregoing embodiments were described with respect to an example that the blocks BK were formed with each block BK having 512 sense amplifiers SA. The present invention is not limited to such embodiments. For example, the present invention also may be applied to a structure where each of blocks BK formed has 256 or 1024 sense amplifiers SA. The size of the block BK may be established in accordance with the number of bits of the data to be inputted/outputted simultaneously.

The foregoing embodiments were described with respect to an example that all the address signals were inputted at once. The present invention is not limited to such embodiments. For example, the present invention also may be applied to a structure where address signals are received in time division, which can further reduce the number of address signal terminals.

The foregoing embodiments were described with respect to an example that there were formed, as data bus lines, the read data bus lines RDB for transferring the read data and the write data bus lines WDB for transferring the write data. The present invention is not limited to such embodiments. For example, the present invention also may be applied to a structure where the data bus lines are bus lines for both inputting and outputting (input-output common bus lines).

The foregoing third and fourth embodiments were described with respect to examples that the read and write data bus lines RDB and WDB were of single-phase, respectively. The present invention is not limited to such embodiments. For example, the present invention also may be applied to a structure where the read and write data bus lines RDB and WDB both are of single-phase. In such a case, the area of the layout of the data bus lines can be further reduced.

The invention is not limited to the above embodiments and various modifications may be made without departing from the spirit and scope of the invention. Any improvement may be made in part or all of the components.

What is claimed:

1. A semiconductor memory comprising:
   a plurality of memory cells;
   a plurality of word lines for selecting the memory cells;
   a plurality of bit lines coupled to said memory cells for transferring data;
   a plurality of sense amplifiers respectively connected to said bit lines for amplifying the data transferred to said bit lines;
   a data control circuit that controls said sense amplifiers for amplifying and outputting all the data read from all memory cells to the exterior of the memory, said all memory cells being specified by a selected one of the word lines, and for amplifying and writing the data inputted from the exterior into all memory cells that are specified by a selected one of the word lines.

2. The semiconductor memory according to claim 1, further comprising a plurality of data bus lines respectively formed corresponding to said bit lines for inputting/outputting the data from/to said exterior.

3. The semiconductor memory according to claim 2, wherein said data bus lines are wired along a wiring direction of said bit lines.

4. The semiconductor memory according to claim 3, wherein
   said data bus lines are formed by using wiring layer(s) different from a wiring layer of said bit lines, and
   a wiring pitch of said data bus lines is equal to an integral multiple of a wiring pitch of said bit lines.

5. The semiconductor memory according to claim 3, wherein
   said data bus lines are formed by using wiring layer(s) different from a wiring layer of said bit lines, and
   a total number of said data bus lines is equal to an integral multiple of the number of bit line pairs each composed of two of said bit lines.

6. The semiconductor memory according to claim 2, wherein said data bus lines are composed of read data bus lines for transferring the data read from said memory cells and write data bus lines for transferring the data to be written into said memory cells.

7. The semiconductor memory according to claim 6, wherein at least one of said read data bus lines and said write data bus lines is composed of complementary data line pair.

8. The semiconductor memory according to claim 6, wherein both said read data bus lines and said write data bus lines are of single-phase.

9. The semiconductor memory according to claim 2, wherein said data bus lines are input-output common bus lines for transferring the data read from said memory cells and the data to be written into said memory cells.

10. The semiconductor memory according to claim 2, further comprising a plurality of switches for connecting said bit lines to said data bus lines respectively, said plurality of switches being turned on simultaneously in response to activation of said sense amplifiers.

11. The semiconductor memory according to claim 2, wherein
   said bit lines are composed of complementary bit line pairs, and
   said data bus lines are composed of complementary data line pairs corresponding to said complementary bit line pairs.

12. The semiconductor memory according to claim 1, wherein
   said data control circuit transfers to said bit lines the data to be written into said memory cells, the transfer done during a write operation and before said one of the word lines is selected.

13. The semiconductor memory according to claim 1, wherein
   said data control circuit transfers to said bit lines the data to be written into said memory cells, the transfer done during a write operation and before said sense amplifiers amplify the data held in said memory cells.

14. The semiconductor memory according to claim 1, wherein address signals for selecting said memory cells are supplied from the exterior at once.

15. The semiconductor memory according to claim 14, wherein
   said one of the word lines is selected by using all of said address signals.

16. The semiconductor memory according to claim 1, further comprising
   a precharge control circuit for resetting said bit lines to a predetermined voltage, wherein
      in a write operation, said precharge control circuit is disabled before the data is written into said memory cells.

17. The semiconductor memory according to claim 1, further comprising a plurality of banks operating independently and each including said memory cells, said bit lines, and said sense amplifiers.

18. The semiconductor memory according to claim 1, wherein
   said word lines are composed of main word line and sub word lines.

19. The semiconductor memory according to claim 1, wherein said data control circuit outputs all the data amplified simultaneously by said sense amplifiers to the exterior in time division, and writes into said memory cells all the data inputted in time division from the exterior and amplified simultaneously by said sense amplifiers.

* * * * *